(12) United States Patent
Ohkubo et al.

(10) Patent No.: US 7,544,940 B2
(45) Date of Patent: Jun. 9, 2009

(54) SEMICONDUCTOR DEVICE INCLUDING VANADIUM OXIDE SENSOR ELEMENT WITH RESTRICTED CURRENT DENSITY

(75) Inventors: Hiroaki Ohkubo, Kanagawa (JP); Yasutaka Nakashiba, Kanagawa (JP)

(73) Assignee: NEC Electronics Corporation, Kawasaki-Shi (JP)

( * ) Notice: Subject to any disclaimer, the term of this patent is extended or adjusted under 35 U.S.C. 154(b) by 171 days.

(21) Appl. No.: 11/135,468

(22) Filed: May 24, 2005

(65) Prior Publication Data

US 2005/0269512 A1 Dec. 8, 2005

(30) Foreign Application Priority Data

May 24, 2004 (JP) .............................. 2004-153456

(51) Int. Cl.
*G01J 5/00* (2006.01)
*G01J 5/12* (2006.01)
*H01L 31/058* (2006.01)

(52) U.S. Cl. .................... 250/338.1; 257/467; 257/468; 257/536; 257/537; 250/338.4; 250/339.04

(58) Field of Classification Search .............. 250/338.1, 250/339.01, 338.4; 257/467–470, 536–537
See application file for complete search history.

(56) References Cited

U.S. PATENT DOCUMENTS

| 4,320,664 | A | * | 3/1982 | Rehn et al. ..................... 73/708 |
| 5,008,541 | A | * | 4/1991 | Audaire et al. ............ 250/338.3 |
| 5,243,858 | A | * | 9/1993 | Erskine et al. ............ 73/204.26 |
| 5,397,897 | A | * | 3/1995 | Komatsu et al. .......... 250/338.4 |
| 5,639,163 | A | * | 6/1997 | Davidson et al. ............. 374/178 |
| 5,726,481 | A | * | 3/1998 | Moody ......................... 257/467 |
| 6,031,231 | A | * | 2/2000 | Kimata et al. ................ 250/332 |
| 6,441,374 | B1 | * | 8/2002 | Kawano et al. ........... 250/338.1 |
| 6,777,681 | B1 | * | 8/2004 | Schimert et al. .......... 250/338.1 |
| 2001/0010360 | A1 | * | 8/2001 | Oda .......................... 250/338.1 |
| 2001/0040216 | A1 | * | 11/2001 | Knauth et al. ................ 250/352 |
| 2002/0166968 | A1 | * | 11/2002 | Bradley ..................... 250/338.1 |
| 2003/0067344 | A1 | * | 4/2003 | Nanba et al. ................. 327/513 |
| 2003/0071215 | A1 | * | 4/2003 | Ajisawa .................... 250/338.1 |

FOREIGN PATENT DOCUMENTS

| JP | 1-302849 | 12/1989 |
| JP | 9-229778 | 9/1997 |
| JP | 11-118567 | 4/1999 |
| JP | 11-330051 | 11/1999 |
| JP | 2001-099705 | 4/2001 |
| JP | 2001-303236 | 10/2001 |
| JP | 2002-267530 | 9/2002 |
| JP | 2003-121255 | 4/2003 |
| JP | 2003-121268 | 4/2003 |

* cited by examiner

*Primary Examiner*—David P Porta
*Assistant Examiner*—Casey Bryant
(74) *Attorney, Agent, or Firm*—Young & Thompson

(57) ABSTRACT

In a semiconductor device including a semiconductor substrate, and at least one sensor element made of vanadium oxide formed over the semiconductor substrate, the sensor element is designed so that a density of a current flowing through the sensor element is between 0 and 100 $\mu A/\mu m^2$.

9 Claims, 5 Drawing Sheets

SEMICONDUCTOR DEVICE INCLUDING VANADIUM OXIDE SENSOR ELEMENT WITH RESTRICTED CURRENT DENSITY

BACKGROUND OF THE INVENTION

1. Field of the Invention

The present invention relates to a semiconductor device including a sensor element made of vanadium oxide serving as a temperature sensor or an infrared sensor.

2. Description of the Related Art

Recently, temperature sensors have been introduced into a large scale integrated circuit (LSI) device to monitor the ambient temperature thereof (see: JP-1-302849-A). As a result, when the ambient temperature exceeds a normal temperature, a bias voltage applied to the LSI device is stopped to surely prevent the LSI device from being destroyed thermally due to the rise of the ambient temperature.

A first prior art temperature sensor is constructed by a temperature sensor element formed by a diode and a resistor having different temperature coefficients (also see: JP-1-302849-A).

In the above-described first prior art temperature sensor, however, since the temperature coefficient of the diode is so small that the difference in temperature coefficient between the diode and the resistor is small, a large signal-to-noise ratio (SNR) cannot be expected.

A second prior art temperature sensor is constructed by a temperature sensor element formed by a parasitic bipolar transistor or a parasitic pn diode (see: JP-9-229778-A). Since the parasitic bipolar transistor or the parasitic diode can be formed by a conventional MOS manufacturing process, the manufacturing cost can be decreased.

In the above-described second prior art temperature sensor, however, since the temperature coefficient of the parasitic bipolar transistor or the parasitic diode is still small, for example, about 0.2 (%/K), a large SNR cannot be expected.

A third prior art temperature sensor is constructed by a temperature sensor element made of vanadium oxide (see: JP-11-330051-A). Since the temperature coefficient of vanadium oxide is very large, a large SNR can be expected.

Note that stable vanadium oxide is represented by a chemical formula $VO_2$ or $V_2O_5$, generally, $VO_X$ where X is about 2.

In the above-described third prior art temperature sensor, however, since a current is supplied to the vanadium oxide temperature sensor element, when an excessive current is supplied thereto, the vanadium oxide temperature sensor element would be broken down.

Also, JP-11-118567-A and JP-2003-121268—A disclose a bridge circuit including temperature sensor elements to enhance the sensitivity and a temperature detecting circuit connected to the two output terminals of the bridge circuit.

On the other hand, a prior art infrared sensor is constructed by an infrared sensor element made of vanadium oxide (see: JP-2001-0997-05-A). Since the temperature coefficient of vanadium oxide is very large, a large SNR can be expected.

Even in the above-described prior art infrared sensor, however, since a current is supplied to the vanadium oxide infrared sensor element, when an excessive current is supplied thereto, the vanadium oxide infrared sensor element would be broken down. Note that the above-mentioned infrared sensor is applied to an infrared camera formed by a plurality of infrared sensors to which pulse-shaped currents are supplied. In this case, if the number of pixels is so small that the vanadium oxide infrared sensor elements are large in size, such pulse-shaped currents supplied thereto hardly break down the vanadium oxide infrared sensor elements. On the other hand, if the number of pixels is so large that the vanadium oxide infrared sensor elements are small in size, such pulse-shaped currents supplied thereto would break down the vanadium oxide infrared sensor elements.

SUMMARY OF THE INVENTION

It is an object of the present invention to provide a semiconductor device including at least one sensor element made of vanadium oxide capable of avoiding the breakdown thereof.

According to the present invention, in a semiconductor device including a semiconductor substrate and at least one sensor element made of vanadium oxide formed over the semiconductor substrate, the sensor element is designed so that a density of a current flowing through the sensor element is between 0 and 100 $\mu A/\mu m^2$.

BRIEF DESCRIPTION OF THE DRAWINGS

The present invention will be more clearly understood from the description set forth below, with reference to the accompanying drawings, wherein.

DESCRIPTION OF THE PREFERRED EMBODIMENTS

A sensor element made of vanadium oxide according to the present invention will be explained with reference to FIGS. 1A and 1B.

Figure 1A:
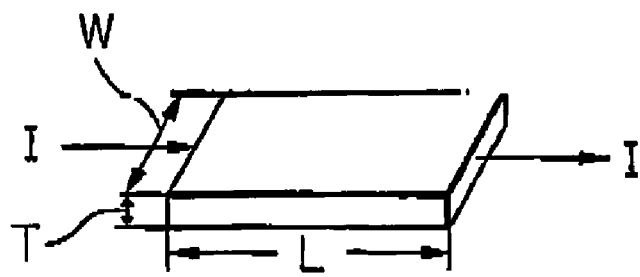
FIG. 1A is a perspective view illustrating a sensor element made of vanadium oxide according to the present invention.

In FIG. 1A, a sensor element made of vanadium oxide has a length L, a width W and a thickness T (=0.1 μm).

Figure 1B:
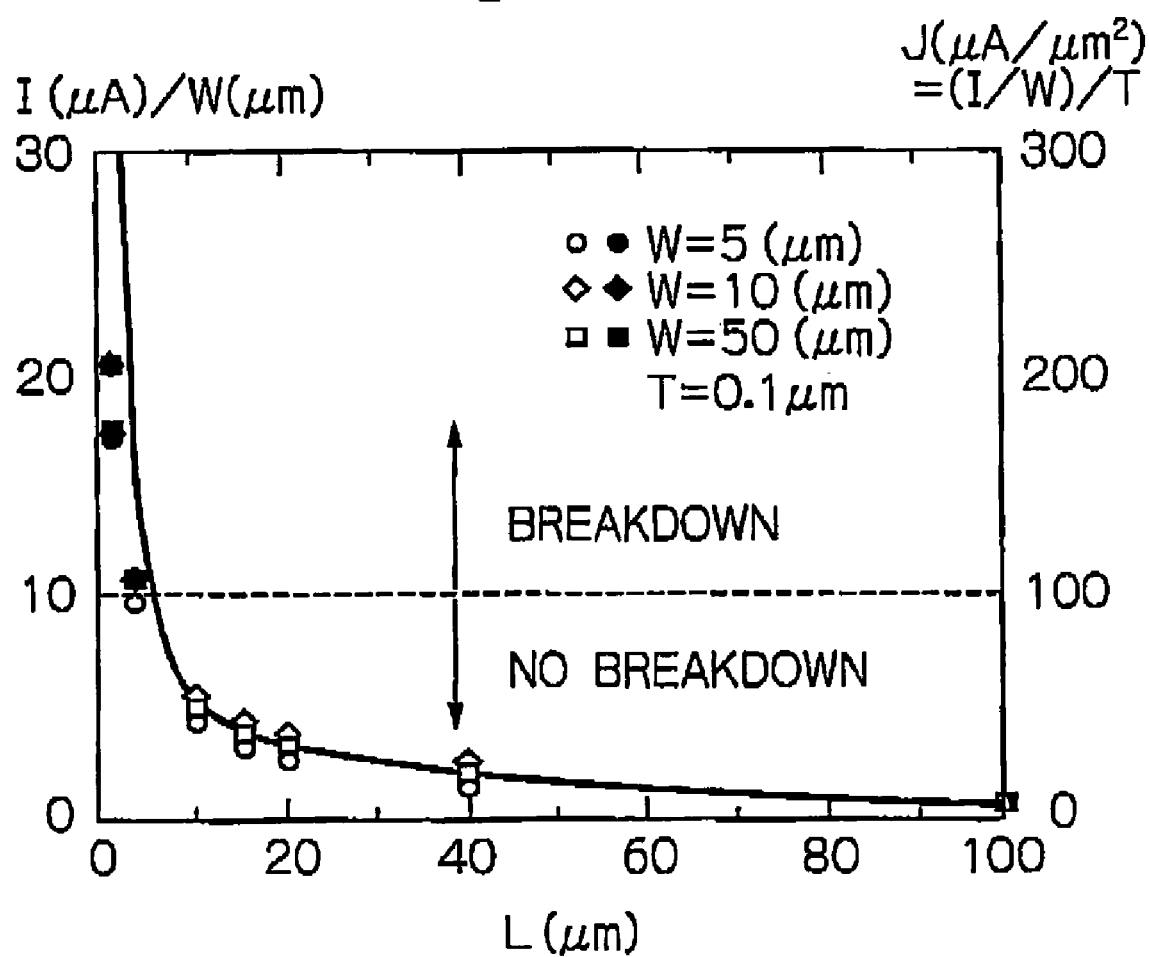
FIG. 1B is a graph showing the length L-to-current I/W characteristics of the sensor element of FIG. 1A.

According to the inventors' experiments, when a voltage of 1V was applied between the terminals of the sensor element of FIG. 1A, a current I flowing therethrough was as shown in FIG. 1B. In FIG. 1B, the larger the length L, the smaller the current I/the width W. In this case, when I(μA)/W(μm) was larger than 10, the sensor element, broke down. On the other hand, when I(μA)/W(μm) was smaller than 10, the sensor element of FIG. 1A did not break down. In other words, when a current density $J(\mu A/\mu m^2)=(I/W)/T(>0)$ was smaller than 100, the sensor element of FIG. 1A did not break down. Thus, according to the present invention, the sensor element of FIG. 1A is designed so that a current density J flowing therethrough is smaller than 100 $\mu A/\mu m^2$.

Figure 2:
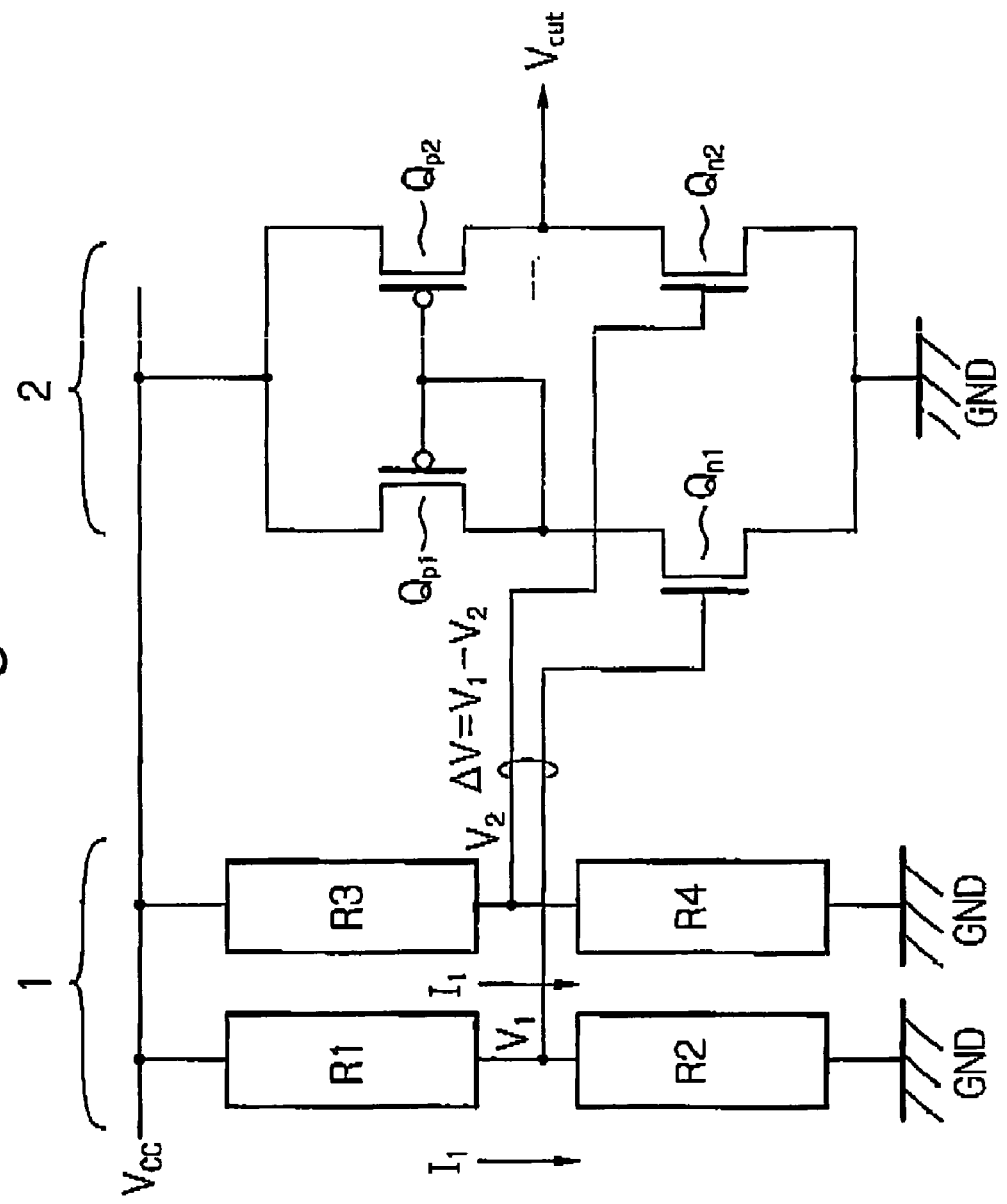
FIG. 2 is a circuit diagram illustrating a first embodiment of the semiconductor device including a temperature sensor element made of vanadium oxide according to the present invention.

In FIG. 2, which illustrates a first embodiment of the semiconductor device according to the present invention, this semiconductor device forms a temperature sensor which is constructed by a temperature sensing circuit 1 and a differential amplifier 2.

The temperature sensing circuit 1 is constructed by sensor elements (temperature monitor resistors) R1 and R2 connected in series between a power supply terminal $V_{cc}$ and a ground terminal GND and temperature monitor resistors R3 and R4 connected in series between the power supply terminal $V_{cc}$ and the ground terminal GND. Also, the temperature monitor resistors R2 and R3 are made of vanadium oxide whose temperature coefficient is −1.5(%/K), and the temperature monitor resistors R1 and R4 are made of amorphous silicon whose temperature coefficient is 0.3(%/K). Further, assume that the resistance values of the temperature monitor resistors R1, R2, R3 and R4 are equal to 25 kΩ at a room temperature of 25° C. In this case, when the temperature is −50° C., the resistance values of the temperature monitor resistors R2 and R3 are 77 kΩ, and the resistance values of the temperature monitor resistors R1 and 14 are 20 kΩ, and when the temperature is 100° C., the resistance values of the temperature monitor resistors R2 and R3 are 8 kΩ and the resistance values of the temperature monitor resistors R1 and R4 are 30 kΩ. Therefore, when the temperature is changed from −50° C. to 100° C., the total resistance value of the temperature monitor resistors R1 and R2 and the total resistance value of the temperature monitor resistors R3 and R4 are changed from 97 kΩ to 38 kΩ.

Also, assume that the power supply terminal $V_{cc}$ is at 3.3V and the ground terminal GND is at 0V, then, a current $I_1$ flowing through the temperature monitor resistors R1 and R2 and a current $I_2$ flowing through the temperature monitor resistors R3 and R4 are changed from about 34 to 87 µA.

If the width W and thickness T of the temperature monitor resistors R2 and R3 is 20 µm and 0.2 µm, respectively, the cross-section of the temperature monitor resistors R2 and R3 is 4 µm$^2$. Therefore, the current density J flowing through the temperature monitor resistors R2 and R3 is 8.5 to 21.8 µA/µm$^2$ which satisfies the above-mentioned condition that the current density J is between 0 and 100 µA/µm$^2$, Also, the differential amplifier 2 amplifies the difference ΔV between a sense voltage $V_1$ at a connection between the temperature monitor resistors R1 and R2 and a sense voltage $V_2$ at a connection between the temperature resistors R3 and R4 to generate an output voltage $V_{out}$ corresponding to the ambient temperature or the heat generated by an internal logic circuit (not shown). In more detail, a p-channel load MOS transistor $Q_{p1}$ and an N-channel MOS transistor $Q_{n1}$ for receiving the sense voltage $V_1$ of the temperature sensing circuit 1 are connected in series between the power supply terminal $V_{cc}$ and the ground terminal GND, and a p-channel load MOS transistor $Q_{p2}$ and an N-channel MOS transistor $Q_{n2}$ for receiving the sense voltage $V_2$ of the temperature sensing circuit 1 are connected in series between the power supply terminal $V_{cc}$ and the ground terminal GND. In this case, the transistors $Q_{p1}$ and $Q_{p2}$ form a current mirror circuit.

Figure 3:
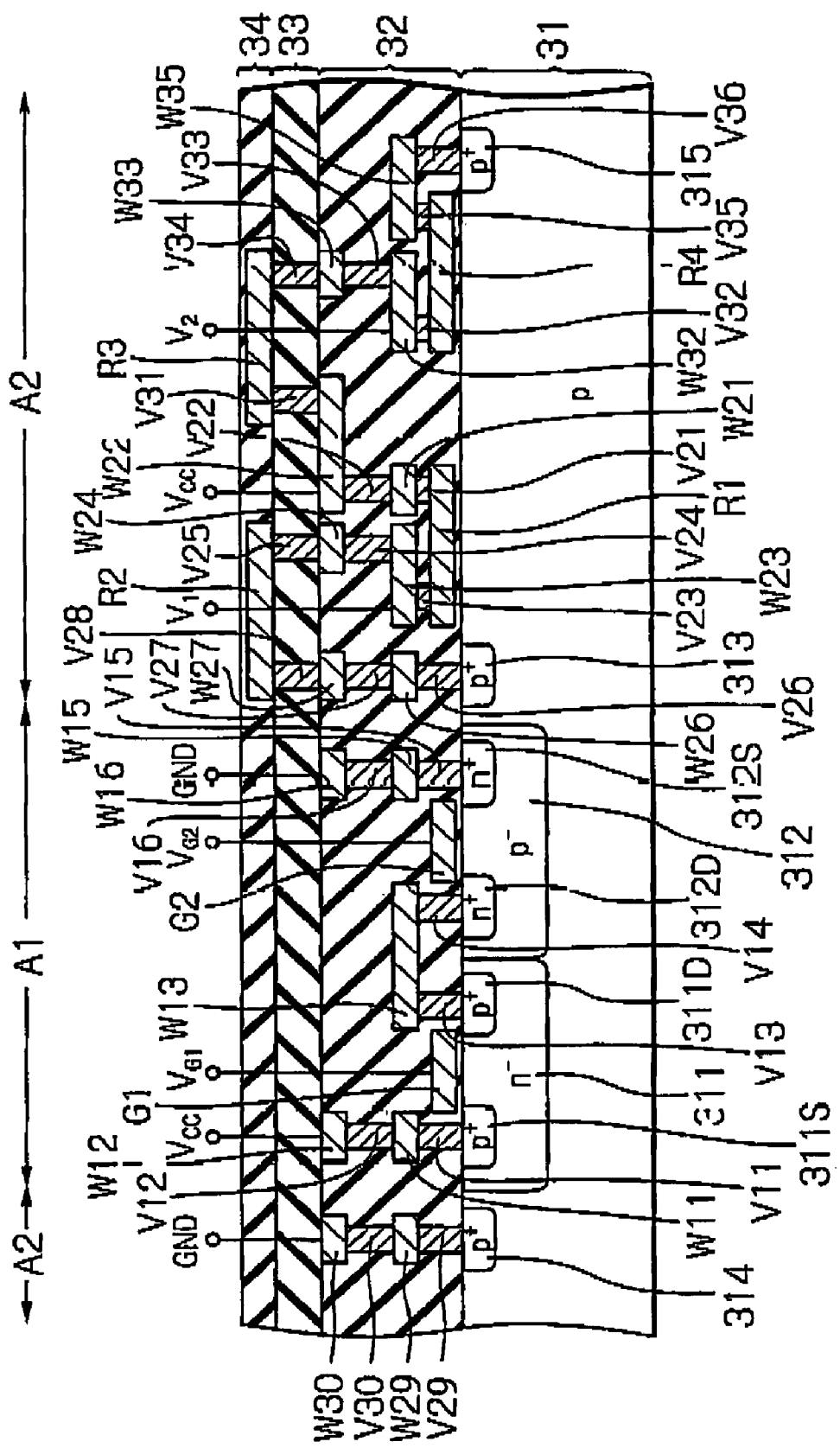
FIG. 3 is a cross-sectional view of the semiconductor device of FIG. 2.

In FIG. 3, which is a cross-sectional view of the semiconductor device of FIG. 2, this semiconductor device is constructed by a p-type monocrystalline silicon substrate 31, a multi-layer interconnection layer 32 formed on the silicon substrate 31, an insulating layer 33 formed on the multi-layer interconnection layer 32 and a sheet layer 34 formed on the insulating layer 33.

The multi-layer interconnection layer 32 is a stacked layer formed of a plurality of conductive layers and a plurality of insulating layers.

The sheet layer 34 is used only for covering the vanadium oxide, not for the conventional conductive layers.

The semiconductor device of FIG. 3 is divided into a logic circuit area A1 for a logic circuit, the differential amplifier 2 of FIG. 2 and the like and a temperature sensing area A2 for the temperature sensing circuit 1 of FIG. 2.

In the logic circuit area A1, one typical complementary metal oxide silicon (CMOS) transistor, i.e., one p-channel MOS transistor and one n-channel MOS transistor are formed. That is, an n type well region 311 with p$^+$-type impurity diffusion regions 311S and 311D and a p$^-$-type well region 312 with n$^1$-type impurity diffusion regions 312S and 312D are formed in the silicon substrate 31. Also, gate electrodes G1 and G2, to which voltages $V_{G1}$ and $V_{G2}$ are applied, are formed over the n$^-$-type well region 311 and the p$^-$-type well region 312, respectively. Further, the p$^+$-type impurity diffusion region 311S is connected through a via structure V11 to a wiring layer W11 which is also connected through a via structure V12 to a wiring layer W12 to which the power supply voltage $V_{cc}$ is applied. The p$^+$-type impurity diffusion region 311D is connected through a via structure V13 to a wiring layer W13, and the n$^{30}$-type impurity diffusion region 312D is connected through a via structure V14 to the wiring layer W13. The n$^+$-type impurity diffusion region 312S is connected through a via structure V15 to a wiring layer W15 which is also connected through a via structure V16 to a wiring layer W16 to which the ground voltage GND is applied.

The temperature sensing area A2 is explained next.

The temperature monitor resistors R2 and R3 made of vanadium oxide (VO$_x$) are formed on the insulating layer 33 and are covered by the sheet layer 34. The temperature monitor resistors R2 and R3 have the same rectangular shape of (10 to 100 µm)×(10 to 100 µm) with a thickness of 0.1 to 0.2 µm. The temperature monitor resistors R2 and R3 have a volume resistivity of 0.01 to 10 Ω·cm and a temperature coefficient of −1.5(%/K).

The temperature monitor resistors R1 and R4 made of n-type impurities duped amorphous silicon are formed over the silicon substrate 31 within the multi-layer interconnection layer 32. The temperature monitor resistors R2 and R3 have the same rectangular shape of (1 to 100 µm)×(1 to 100 µm) with a thickness of 0.1 to 0.3 µm. The temperature monitor resistors R2 and R3 have a temperature coefficient of 0.3(%/K). That is, the absolute value of the temperature coefficient of the temperature monitor resistors R1 and R4 is smaller than that of the temperature monitor resistors R2 and R3.

Note that the resistance values of the temperature monitor resistors R1, R2, R3 and R4 are approximately the same, for example, 25 kΩ at a room temperature of 25° C.

A series of the temperature monitor resistors R1 and R2 is explained next.

An end of the temperature monitor resistor R1 is connected through a via structure V21 to a wiring layer W21 which is also connected through a via structure V22 to a wiring layer W22 to which the power supply voltage $V_{cc}$ is applied.

The other end of the temperature monitor resistor R1 is connected through a via structure V23 to a wiring layer W23 which is also connected through a via structure V24 to a wiring layer W24 which is further connected through a via structure V25 to an end of the temperature monitor resistor R2.

A p$^+$-type impurity diffusion region 313 in the silicon substrate 31 is connected through a via structure V26 to a wiring layer W26 which is also connected through a via structure V27 to a wiring layer WZ7 which is further connected through a via structure V28 to the other end of the temperature monitor resistor R2.

A p$^+$-type impurity diffusion region 314 is connected through a via structure V29 to a wiring layer W29 which is also connected through a via structure V30 to a wiring structure W30 to which the ground voltage GND is applied.

Thus, the p$^+$-type impurity diffusion region 313 is the p-type silicon substrate 31.

The wiring layer W23 generates the sense voltage $V_1$ of FIG. 2.

Thus, the series of the temperature monitor resistors R1 and R2 are connected between the power supply terminal $V_{cc}$ and the ground terminal GND.

A series of the temperature monitor resistors R3 and R4 is explained next.

An end of the temperature monitor resistor R3 is connected through a via structure 31 to the wiring layer 22 to which the power supply voltage $V_{cc}$ is applied.

An end of the temperature monitor resistor R4 is connected through a via structure V32 to a wiring layer W32 which is also connected through a via structure V33 to a wiring layer W33 which is further connected to the other end of the temperature monitor resistor R3.

Another end of the temperature monitor resistor R4 is connected through a via structure V35 to a wiring layer W35 which is also connected through a via structure V36 to a p$^+$-type impurity diffusion region 315 which is grounded by the p$^+$-type impurity diffusion region 314 in the silicon substrate 31.

The wiring layer W32 generates the sense voltage $V_2$ of FIG. 2.

Thus, the series of the temperature monitor resistors R3 and R4 are connected between the power supply terminal $V_{cc}$ and the ground terminal GND.

In FIG. 3, the gate electrodes G1 and G2 are formed by the same layer. The temperature monitor resistors R3 and R4 are formed by the same layer. The via structures V11, V13, V14, V15, V21, V23, V26, V32, V35 and V36 are formed by the same material. The wiring layers W11, W13, W15, W21, W23, W26, W32 and W35 are formed by the same layer. The via structures V12, V16, V22, V24, V27, V30 and V33 are formed by the same layer. The wiring layers W12, W16, W22, W24, W27, W30 and W33 are formed by the same layer. The via structures V25, V28, V31 and V33 are formed by the same layer. The temperature monitor resistors R2 and R3 are formed by the same layer.

The operation of the semiconductor device of FIG. 2 is explained next.

As explained above, when $V_{cc}$=3.3V and GND=0V, the current $I_1$ flowing through the temperature monitor resistors R1 and R2 and the current $I_2$ flowing trough the temperature monitor resistors R3 and R4 are from 34 to 87 µA, and the current density J of the temperature monitor resistors R2 and R3 is from 8.5 to 21.8 µA/µm$^2$. As a result, the sense voltage $V_1$ at the connection between the temperature monitor resistors R1 and R2 is determined by $V_{cc} \times R2/(R1+R2)$, and the sense voltage V2 at the connection between the temperature monitor resistors R3 and R4 is determined by $V_{cc} \times R4/(R3+R4)$.

When the ambient temperature is increased or the logic circuit area A1 generates heat therein, the temperature monitor resistors R1, R2, R3 and R4 are also heated. Therefore, the decrease in the resistance values of the temperature monitor resistors R2 and R3 is relatively large, while the increase in the resistance values of the temperature monitor resistors R1 and R4 is relatively small. As a result, the sense voltage $V_1$ is decreased and the sense voltage $V_2$ is increased, so that the difference between the sense voltage $V_1$ and $V_2$ is enhanced. Thus, the enhanced difference between the sense voltages $V_1$ and $V_2$ is amplified by the differential amplifier 2 to generate its output voltage $V_{out}$. For example, if the output voltage $V_{out}$ its larger than a predetermined value, the bias voltage applied to the logic circuit area A1 of FIG. 3 is stopped.

In FIGS. 2 and 3, since the current density J of the temperature monitor resistors R2 and R3 is smaller than 100 µA/µm$^2$, the temperature monitor resistors R2 and R3 can be prevented from being destroyed.

Also, since the temperature monitor resistors R2 and R3 are made of vanadium oxide having a large temperature coefficient, i.e., about 1.5 %/K, a higher SNR can be obtained.

Further, the temperature sensing circuit 1, i.e., the bridge circuit formed by the temperature monitor resistors R1, R2, R3 and R4 can increase the accuracy of measurement of temperature, and the differential amplifier 2 amplifies the difference in output between the bridge circuit can further increase the accuracy of measurement of temperature.

For example, at a room temperature of 25° C., if each of the temperature monitor resistors R1, R2, R3 and R4 is 1 kΩ, the sense voltages $V_1$ and $V_2$ under $V_{cc}$=3.3V and GND=0V are $$V_1 = 3.3 \times 1/(1+1)$$
$$= 1.65 \text{ V}$$
$$V_2 = 3.3 \times 1/(1+1)$$
$$= 1.65 \text{ V}$$
$$\therefore \Delta V = V_2 - V_1$$
$$= 0 \text{ V}$$

Then, the temperature is increased by 10° C. to 35° C., $$R2 = R3$$
$$= (1 - 0.015 \times 10) \cdot 1 \ k\Omega$$
$$= 0.85 \ k\Omega$$
$$R1 = R4$$
$$= (1 + 0.003 \times 10) \cdot 1 \ k\Omega$$
$$= 1.03 \ k\Omega$$
$$\therefore V_1 = 3.3 \times 0.85/(0.85 + 1.03)$$
$$= 1.49 \text{ V}$$
$$V_2 = 3.3 \times 1.03/(0.85 + 1.03)$$
$$= 1.81 \text{ V}$$
$$\Delta V = V_1 - V_2$$
$$= -0.32 \text{ V}$$

Note that the difference ΔV is twice the corresponding difference without the bridge circuit. This difference is further increased by the differential amplifier 2.

In FIG. 3, the temperature monitor resistors (vanadium oxide) R2 and R3 are formed on the insulating layer 33 under the sheet layer 34 and the logic circuit of the logic circuit area A1 within the silicon substrate 31 and the multi-layer interconnection layer 32. Therefore, the logic circuit and the manufacturing equipment therefor is hardly contaminated by vanadium oxide. Note that the temperature monitor resistors (amorphous silicon) R1 and R4 are manufactured by a conventional manufacturing prooooo.

Further, the temperature monitor resistors R1 and R4 can be made of polycrystalline silicon.

Additionally, in FIG. 3, a part of the temperature monitor resistors R2 and R3 can be formed on the logic circuit area A1, which would enhance the integration.

The temperature sensing circuit 1 and the differential amplifier 2 of FIG. 2 can be at a single place or a plurality of places of one chip. In this latter case, a mean value of temperature measurements can be used.

Figure 4:
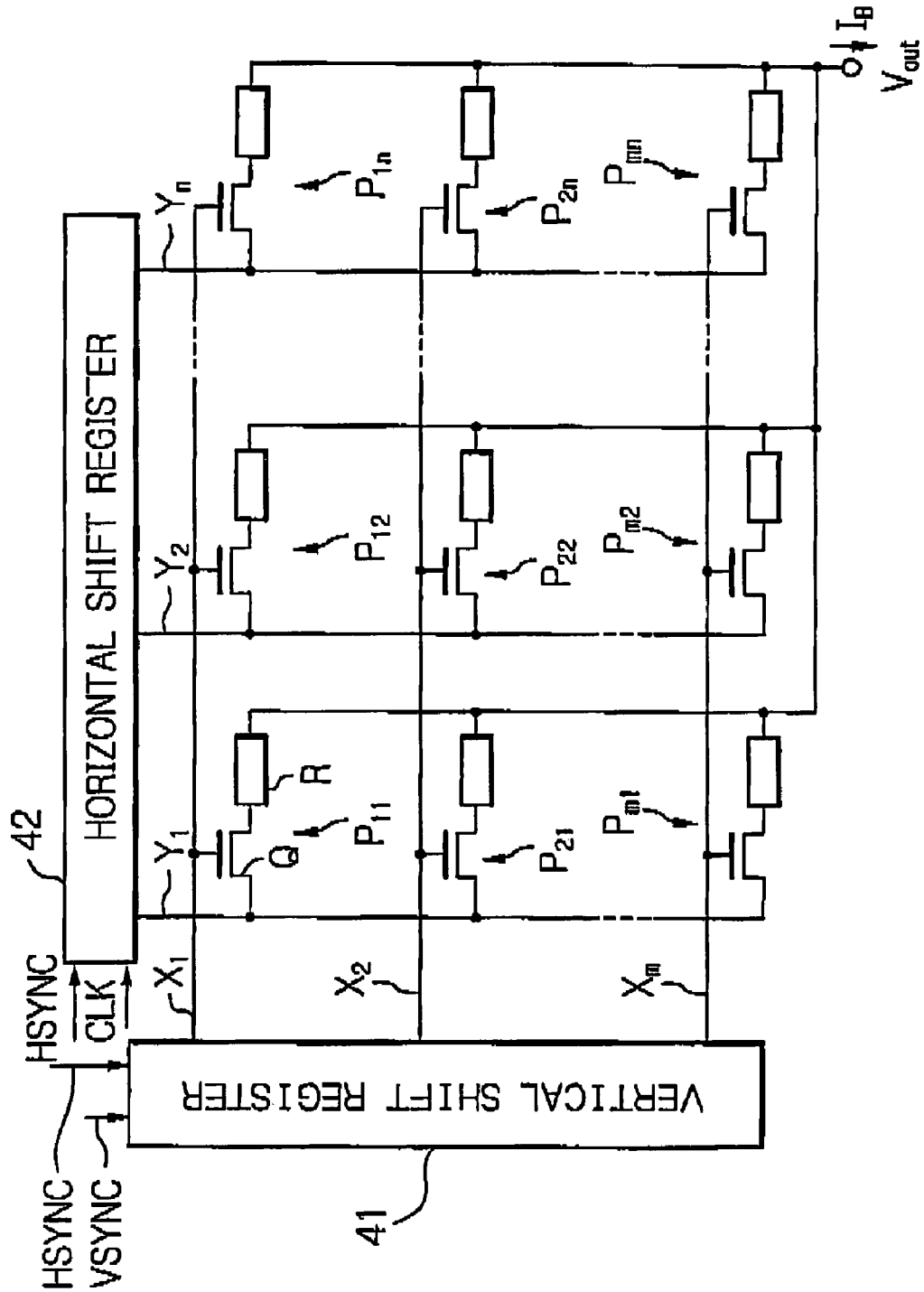
FIG. 4 is a circuit diagram illustrating a second embodiment of the semiconductor device including an infrared sensor element made of vanadium oxide according to the present invention.

In FIG. 4, which illustrates a second embodiment of the semiconductor device according to the present invention, this semiconductor device forms an infrared detecting sensor mounted on an infrared receiving unit of an infrared camera.

In FIG. 4, one pixel $P_{ij}$ (i=1, 2, . . . , m, j=1, 2, . . . , n) formed by a MOS transistor Q and an infrared monitor resistor R is provided at each intersection between gate lines $X_1$, $X_2$, . . . $X_m$ and data lines $Y_1$, $Y_2$, . . . , $Y_n$. The gate lines $X_1$, $X_2$, . . . , $X_m$ are sequentially selected by a vertical shift register 41 which receives a vertical synchronization signal VSYNC and shifts it in accordance with a horizontal synchronization signal HSYNC. On the other hand, the data lines $Y_1$, $Y_2$, . . . , $Y_n$ are sequentially selected by a horizontal shift register 42 which receives the horizontal synchronization signal HSYNC and shifts it in accordance with a clock signal CLK. Thus, in a selected pixel $P_{ij}$, a signal voltage $V_{out}$ is dependent upon its bias current $I_B$ which is dependent upon the resistance of the infrared monitor resistor R of a selected pixel.

Figure 5:
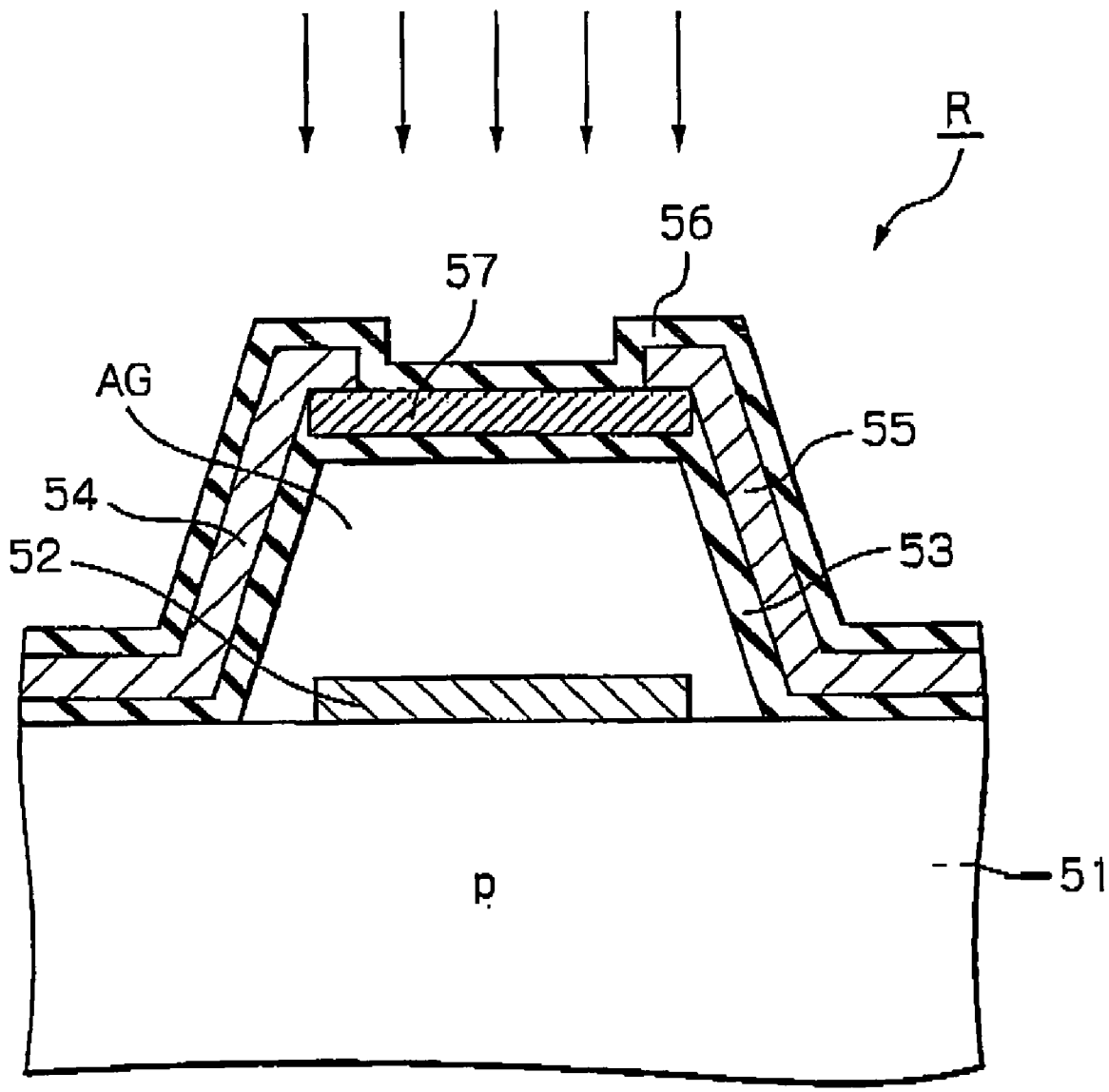
FIG. 5 is a cross-sectional view of the resistor of FIG. 4.

In FIG. 5, which is a cross-sectional view of the infrared monitor resistor R of FIG. 4, reference numeral 51 designates a p-type monocrystalline silicon substrate on which a reflection plate 52 made of Cr/Pt is formed. Also, an insulating layer 53 made of SiN, a pair of conductive beams 54 and 55 made of NiCr and an insulating layer 56 made of SiN are formed, and an infrared sensor element 67 (made of vanadium oxide connected between the conductive beams 54 and 55 are provided. In this case, the infrared sensor element 57 is also supported by the conductive beams 54 and 55, so that an air gap AG is formed. Thus, the infrared sensor element 57 is isolated thermally from the silicon substrate 51.

The infrared sensor element 57 has a length L of 20 µm, a width W of 2 µm and a thickness T of 0.2 µm with a cross section of 0.4 µm$^2$.

The cross section of the infrared sensor element 57 is determined so that the current density J is between 0 and 100 µA/µm$^2$. For example, when no infrared is incident to the infrared sensor element 57, the resistance value of the infrared sensor element 57 is 120 kΩ, and when infrared is incident to the infrared sensor element 57, the resistance value of the infrared sensor element 57 is 95 kΩ. Since the power supply voltage $V_{cc}$ is 3.3V and the ground voltage GND is 0V, the current flowing through the infrared sensor element 57 is 27 to 35 µA at most, which corresponds to a current density of 67 to 88 µA/m$^2$. Thus, the current density can be smaller than 100 µA/µm$^2$, so that the infrared sensor element 57 made of vanadium oxide would hardly breakdown.

When infrared is incident to the device as indicated by arrows in FIG. 5, a part of the infrared is absorbed directly by the infrared sensor element 57, so that the temperature thereof would be increased. Simultaneously, if the infrared passes through the infrared sensor element 57 and the air gap AG to reach the reflection plate 52, this part of the infrared is reflected by the reflection plate 52 and reaches the infrared sensor element 57. Thus, the temperature of the infrared sensor element 57 would be further increased.

The above-mentioned infrared sensor element 57 is supplied with a pulse-shaped bias current $I_B$ by the vertical shift register 41 and the horizontal shift register 42 of FIG. 4. Measurements of the bias current $I_B$ are carried out by a control circuit (not shown) to form an infrared image.

As explained hereinabove, according to the present invention, the current density of an infrared sensor element made of vanadium oxide is between 0 and 100 µA/µm$^2$, the breakdown of a sensor element such as a temperature monitor resistor and an infrared sensor element can be avoided.

The invention claimed is:

1. A semiconductor device comprising:
   a semiconductor substrate;
   at least one sensor element made of vanadium oxide formed over said semiconductor substrate, said sensor element being designed so that a density of a current flowing through said sensor element is between 0 to 100 µA/µm$^2$,
   a multi-layer interconnection layer formed on said semiconductor substrate;
   a logic circuit formed in said semiconductor substrate and said multi-layer interconnection layer; and
   an insulating layer formed on said multi-layer interconnection layer in contact with an uppermost conductive layer thereof,
   said sensor element being formed on said insulating layer, at least a part of said sensor element being in contact with said insulating layer,
   wherein said sensor element is configured so that a resistance of said sensor element is changed in accordance with an ambient temperature of said device, and
   wherein said sensor element is configured so that a resistance of said sensor element is changed in accordance with heat generated from said device.

2. The device as set forth in claim 1, further comprising a sheet layer formed on said insulating layer and said sensor element and adapted to cover said sensor element.

3. The device as set forth in claim 1, wherein said device is configured so that said logic circuit is controlled in accordance with an output signal of said sensor element.

4. The device as set forth in claim 1, wherein at least part of said sensor element is located on said logic circuit.

5. The device as set forth in claim 1, wherein said sensor element is shaped in a sheet.

6. A semiconductor device comprising:
   first and second power supply terminals;
   first and second temperature sensor elements connected in series between said first and second power supply terminals, a first connection between said first and second temperature sensor elements adapted to generate a first sense voltage;
   third and fourth temperature sensor elements connected in series between said first and second power supply terminals, a second connection between said third and fourth temperature sensor elements adapted to generate a second sense voltage;
   a differential amplifier connected to the connection between said first and second temperature sense elements and the connection between said third and fourth temperature sense elements and adapted to amplify the difference in voltage between said first and second connections,
   said second and third temperature sensor elements being made of vanadium oxide,
   said first and fourth sensor elements being made of a material having an absolute value of a resistance temperature coefficient smaller than an absolute value of a resistance temperature coefficient of vanadium oxide, said semiconductor device further comprising:

a semiconductor substrate; and a multi-layer interconnection layer formed on said semiconductor substrate, said multi-layer interconnection layer comprising said second and third temperature sensor elements, said second and third temperature sensor elements being formed on an insulating layer which is formed on said multi-layer interconnection layer in contact with an uppermost conductive layer thereof, at least a part of said second and third temperature sensor elements being in contact with said insulating layer, wherein said first, second, third and fourth temperature sensor elements are configured so that resistance of said first, second, third and fourth temperature sensor elements is changed in accordance with an ambient temperature of said device, and wherein said first, second, third and fourth temperature sensor elements are configured so that resistance of said first, second, third and fourth temperature sensor elements is changed in accordance with heat generated from said device.

7. The device as set forth in claim 6, wherein said first and fourth temperature sense elements are made of amorphous silicon.

8. The device as set forth in claim 6, wherein said first and fourth temperature sense elements are made of polycrystalline silicon.

9. A semiconductor device comprising:

a semiconductor substrate;

at least one temperature sensor element made of vanadium oxide formed over said semiconductor substrate, a multi-layer interconnection layer formed on said semiconductor substrate;

a logic circuit formed in said semiconductor substrate and said multi-layer interconnection layer; and an insulating layer formed vertically above said multi-layer interconnection layer in contact with an uppermost surface of an uppermost conductive layer thereof, said temperature sensor element being formed on said insulating layer, at least a part of said temperature sensor element being in contact with said insulating layer, wherein said temperature sensor element is configured so that a resistance of said temperature sensor element is changed in accordance with an ambient temperature of said device, and wherein said temperature sensor element is configured so that a resistance of said temperature sensor element is changed in accordance with heat generated from said device.

* * * * *